US011462651B2

(12) United States Patent
Li

(10) Patent No.: US 11,462,651 B2
(45) Date of Patent: Oct. 4, 2022

(54) ELECTRONIC DEVICE

(71) Applicant: PanelSemi Corporation, New Taipei (TW)

(72) Inventor: Chin-Tang Li, Tainan (TW)

(73) Assignee: PANELSEMI CORPORATION, New Taipei (TW)

( * ) Notice: Subject to any disclaimer, the term of this patent is extended or adjusted under 35 U.S.C. 154(b) by 96 days.

(21) Appl. No.: 17/067,368

(22) Filed: Oct. 9, 2020

(65) Prior Publication Data

US 2021/0175381 A1 Jun. 10, 2021

(30) Foreign Application Priority Data

Dec. 6, 2019 (TW) ................................. 108144777

(51) Int. Cl.
| | |
|---|---|
| *H01L 29/04* | (2006.01) |
| *H01L 29/10* | (2006.01) |
| *H01L 31/00* | (2006.01) |
| *H01L 31/0392* | (2006.01) |
| *H01L 31/0224* | (2006.01) |
| *H01L 27/32* | (2006.01) |
| *H01L 31/0352* | (2006.01) |

(52) U.S. Cl.
CPC ...... *H01L 31/03926* (2013.01); *H01L 27/326* (2013.01); *H01L 27/3253* (2013.01); *H01L 31/022466* (2013.01); *H01L 31/035281* (2013.01)

(58) Field of Classification Search
CPC ....... H01L 31/03926; H01L 31/022466; H01L 31/035281; H01L 27/3253; H01L 27/326

USPC .......................................................... 257/57
See application file for complete search history.

(56) References Cited

U.S. PATENT DOCUMENTS

| | | |
|---|---|---|
| 2018/0337196 A1 | 11/2018 | Yang |
| 2019/0198490 A1 | 6/2019 | Li |
| 2020/0006404 A1* | 1/2020 | Li .......................... H05K 1/118 |

FOREIGN PATENT DOCUMENTS

| | | |
|---|---|---|
| TW | 201902313 A | 1/2019 |
| TW | 201929215 A | 7/2019 |
| TW | 202002107 A | 1/2020 |

* cited by examiner

*Primary Examiner* — Calvin Y Choi
(74) *Attorney, Agent, or Firm* — Muncy, Geissler, Olds & Lowe, P.C.

(57) ABSTRACT

An electronic device comprises plural first substrates, plural photoelectric structures, a third substrate, plural driving units, plural conductive layers and plural first conductive structures. The first substrates are arranged in coplanar in a first direction. The photoelectric structures are arranged in coplanar in the first direction and disposed on the first substrate. Each photoelectric structure has a second substrate, a signal layer and a photoelectric component. The photoelectric component is electrically connected to the signal line of the signal layer. One of the photoelectric structures straddles two adjacent first substrates. The third substrate is connected to the first substrate or the photoelectric structure. The driving units are distributed on the first substrate or the photoelectric structure, and the driving units correspondingly drive the photoelectric components of the photoelectric structures. The optoelectronic structures are electrically connected to the conductive layers via the first conductive structures, respectively.

22 Claims, 11 Drawing Sheets

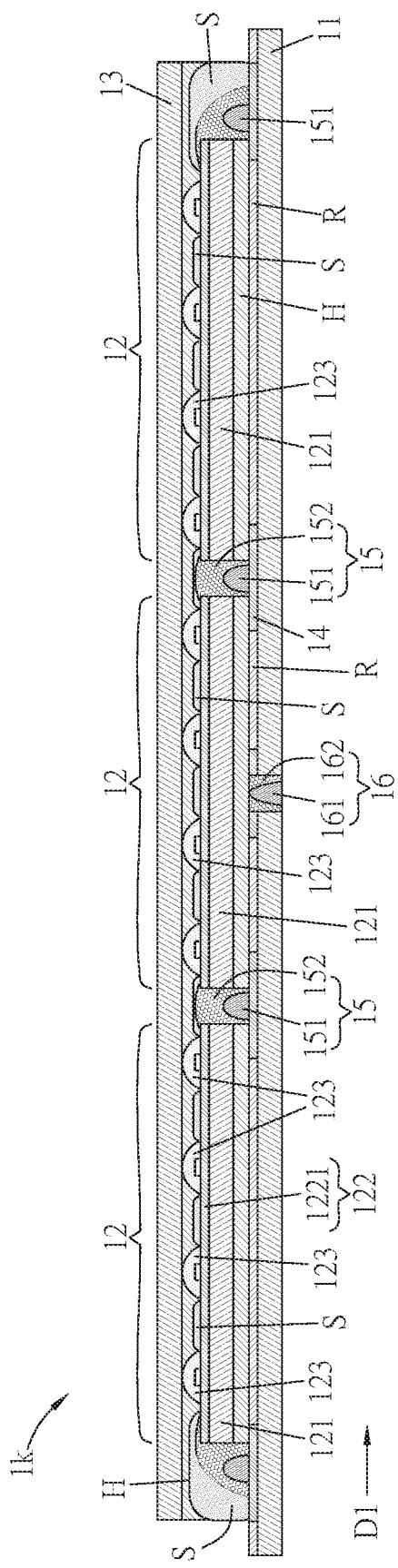
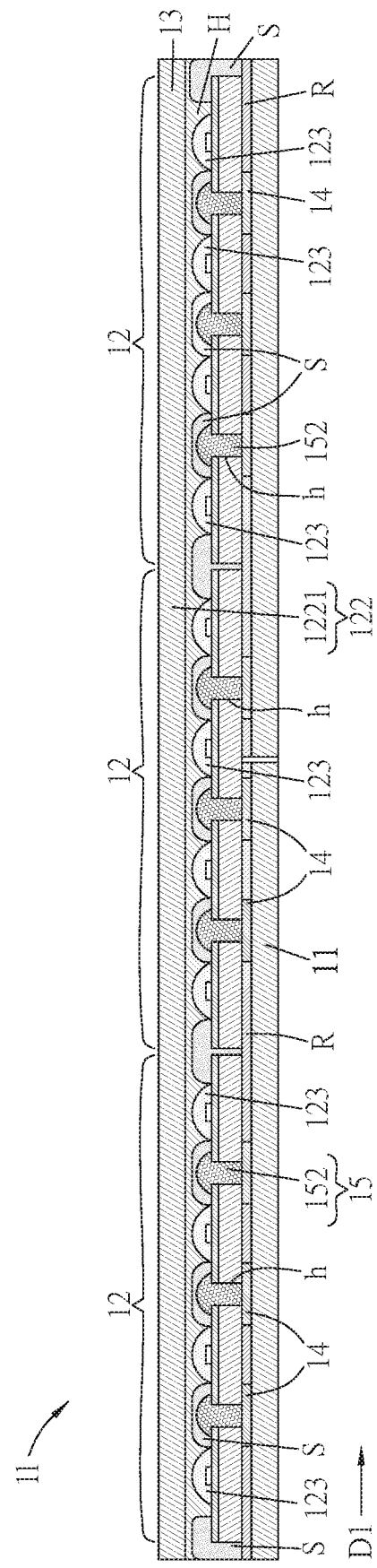
FIG. 6A
FIG. 6B

ELECTRONIC DEVICE

CROSS REFERENCE TO RELATED APPLICATIONS

This Non-provisional application claims priority under 35 U.S.C. § 119(a) on Patent Application No(s). 108144777 filed in Taiwan, Republic of China on Dec. 6, 2019, the entire contents of which are hereby incorporated by reference.

BACKGROUND

Technology Field

The present disclosure relates to an electronic device and, in particular, to an electronic device having lower cost and flexible application.

Description of Related Art

In the conventional manufacturing process of photoelectric device, a plurality of thin-film transistors (TFT) are formed on the substrate to obtain a TFT substrate, and then the TFTs can be provided to drive the corresponding photoelectric components. Regarding the OLED display devices, if the manufacturer wants to fabricate products with different sizes or functions, it is needed to design different thin-film manufacturing processes corresponding to the products with different sizes or functions individually. In addition, the expensive TFT manufacturing processes, photomasks, substrates, and/or materials are needed in these manufacturing processes. These limitations are disadvantaged to various product demands, and the application thereof is lack of flexibility.

SUMMARY

This disclosure provides an electronic device with a lower cost and flexible application.

One or more exemplary embodiments of this present disclosure provides an electronic device comprising a plurality of first substrates, a plurality of photoelectric structures, a third substrate, a plurality of driving units, a plurality of conductive layers, and a plurality of first conductive structures. The first substrates are arranged in coplanar in a first direction along a predefined plane. The photoelectric structures are arranged in coplanar in the first direction and disposed on the first substrates. Each of the photoelectric structures comprises a second substrate, a signal layer and a photoelectric component. The signal layer is distributed on the second substrate and comprises a signal line. The photoelectric component is disposed on the second substrate and electrically connected to the signal line. One of the photoelectric structures straddles adjacent two of the first substrates in the first direction. The third substrate is connected to the first substrates or the photoelectric structures. The driving units are distributed on the first substrates or the photoelectric structures, and the driving units correspondingly drive the photoelectric components of the photoelectric structures, respectively. The conductive layers are distributed on the first substrates, respectively. The optoelectronic structures are electrically connected to the conductive layers via the first conductive structures, respectively.

In one exemplary embodiment, in the corresponding one of the photoelectric structures straddling the adjacent two first substrates, the signal line of the signal layer is electrically connected the conductive layers of the adjacent two first substrates via two of the first conductive structures, respectively. A signal is transmitted from the conductive layer on one of the adjacent two of the first substrates to the conductive layer on the other one of the adjacent two of the first substrates through the signal line or the signal lines of one or more of the photoelectric structures, and through the corresponding ones of the first conductive structures in relation thereto.

In one exemplary embodiment, two or more of the first conductive structures are configured between the adjacent two second substrates.

In one exemplary embodiment, the electronic device further comprises a plurality of first flexible members disposed between adjacent two of the photoelectric structures, and the first flexible members are filled between the first conductive structures.

In one exemplary embodiment, at least one of the first conductive structures is electrically connected to one of the photoelectric structures and one of the conductive layers in relation thereto.

In one exemplary embodiment, the electronic device further comprises a plurality of second conductive structures, and each of the second conductive structures is disposed between adjacent two of the first substrates and electrically connected to the conductive layers of the adjacent two first substrates.

In one exemplary embodiment, a signal is transmitted from the conductive layer on one of the adjacent two of the first substrates to one or more of the photoelectric structures on the other one of the adjacent two of the first substrates through one or more of the second conductive structures in relation thereto.

In one exemplary embodiment, at least one of the second conductive structures is configured between adjacent two of the first substrates.

In one exemplary embodiment, two or more of the second conductive structures are configured between adjacent two of the first substrates, and the electronic device further comprises a plurality of second flexible members disposed between the adjacent two of the first substrates. The second flexible members are filled between the second conductive structures, respectively.

In one exemplary embodiment, each of the first substrates is further defined with a second direction perpendicular to the first direction along the predefined plane, and some of the photoelectric structures are arranged in the second direction and disposed on the first substrates.

In one exemplary embodiment, each of the first substrates is further defined with a second direction perpendicular to the first direction along the predefined plane, and some of the photoelectric structures are arranged in the second direction and straddle adjacent two of the first substrates, respectively.

In one exemplary embodiment, the conductive layer is defined with a first wire extending in the first direction and a second wire perpendicular to the first wire. An additional signal is transmitted from the first wire of the conductive layer of one of the adjacent two first substrates to the conductive layer on the other one of the first adjacent two substrates in the first direction, through the signal line of one of the photoelectric structures straddling the adjacent two first substrates, and through the corresponding ones of the first conductive structures in relation thereto; and the additional signal is further transmitted to the signal line of next one of the photoelectric structures on the other one of the adjacent two first substrates in the second direction, through the signal line of an additional one of the photoelectric structures on the other one of the adjacent two first substrates, with or without the first conductive structures in relation thereto.

In one exemplary embodiment, the conductive layer is defined with a first wire extending in the first direction and a second wire perpendicular to the first wire. An additional signal is transmitted from the first wire of the conductive layer of one of the adjacent ones of the first substrates to the conductive layer on another one of the adjacent ones of the first substrates in the first direction, through the signal line of one photoelectric structure straddling the one and the another one first substrates in the first direction, and through corresponding ones of the first conductive structures in relation thereto; and the additional signal is further transmitted to the signal line of next one of the photoelectric structures on a next one of the adjacent ones of the first substrates in the second direction, through the signal line of an additional one photoelectric structure straddling the another one and the next one first substrates in the second direction, and through corresponding ones of the first conductive structures in relation thereto.

In one exemplary embodiment, each of the first conductive structures comprises a conductive pillar and a conductive material, and the conductive material covers the conductive pillar.

In one exemplary embodiment, the conductive pillar tapers off in a direction toward the photoelectric structures.

In one exemplary embodiment, the third substrate is connected to the first substrates, the second conductive structures are disposed on the third substrate, each of the second conductive structures comprises a conductive pillar and a conductive material, and the conductive material covers the conductive pillar and is electrically connected to the conductive layers on adjacent two of the first substrates.

In one exemplary embodiment, each of the first substrates, the second substrates and the third substrate is a flexible substrate.

In one exemplary embodiment, the electronic device is further defined with a peripheral area. The peripheral area excludes the photoelectric structures. The peripheral area is configured with at least one driving circuit.

In one exemplary embodiment, the peripheral area comprises a connector board, and the driving circuit is disposed on the connector board.

In one exemplary embodiment, a first gap is defined between adjacent two of the first substrates, a second gap is defined between adjacent two of the second substrates, and the first gap and the second gap are not overlapped in a vertical direction perpendicular to the predefined plane.

In one exemplary embodiment, the amount of the third substrates are plural, and the third substrates are arranged in coplanar. A third gap is defined between adjacent two of the third substrates, and the first gap, the second gap and the third gap are not overlapped in the vertical direction.

BRIEF DESCRIPTION OF THE DRAWINGS

The disclosure will become more fully understood from the detailed description and accompanying drawings, which are given for illustration only, and thus are not limitative of the present disclosure, and wherein:

FIGS. 2A to 2B, 3, 4A to 4C, 5A to 5D, and 6A to 6B are schematic diagrams showing the electronic devices according to different embodiments of this disclosure.

DETAILED DESCRIPTION OF THE DISCLOSURE

The present disclosure will be apparent from the following detailed description, which proceeds with reference to the accompanying drawings, wherein the same references relate to the same elements. The applicant of this application also owns the following pending Taiwan applications including: (1) Patent Application No. 108118102, entitled "Electronic device and manufacturing method thereof"; (2) Patent Application No. 107122662, entitled "Electronic device and manufacturing method thereof"; (3) Patent Application No. 108107174, entitled "Electronic device and manufacturing method thereof"; (4) Patent Application No. 106145374, entitled "Electronic package unit and manufacturing method thereof, and electronic device"; and (5) Patent Application No. 106116725, entitled "Electronic device and manufacturing method thereof"; the entire contents of which are hereby incorporated by reference.

Figure 1A:
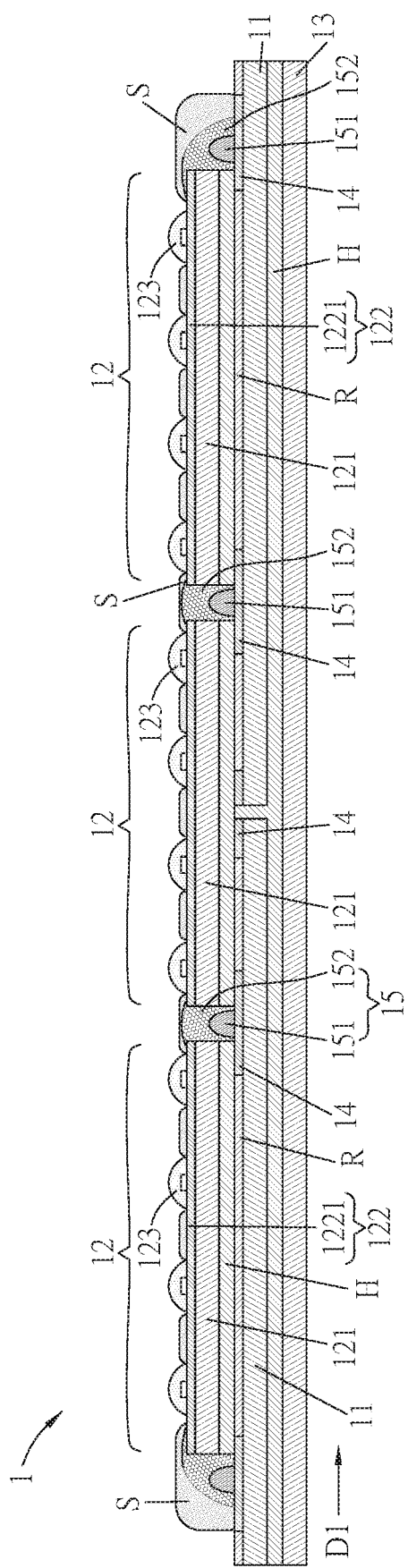
FIG. 1A is a schematic diagram showing an electronic device according to an embodiment of this disclosure.
Figure 1B:
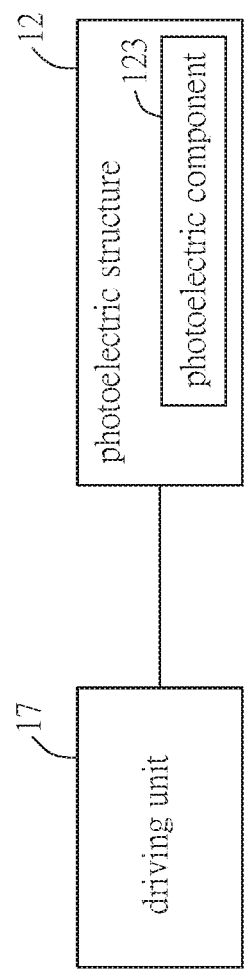
FIG. 1B is a block diagram showing the driving units and photoelectric structures in the electronic device according to the embodiment of this disclosure.
Figure 1C:
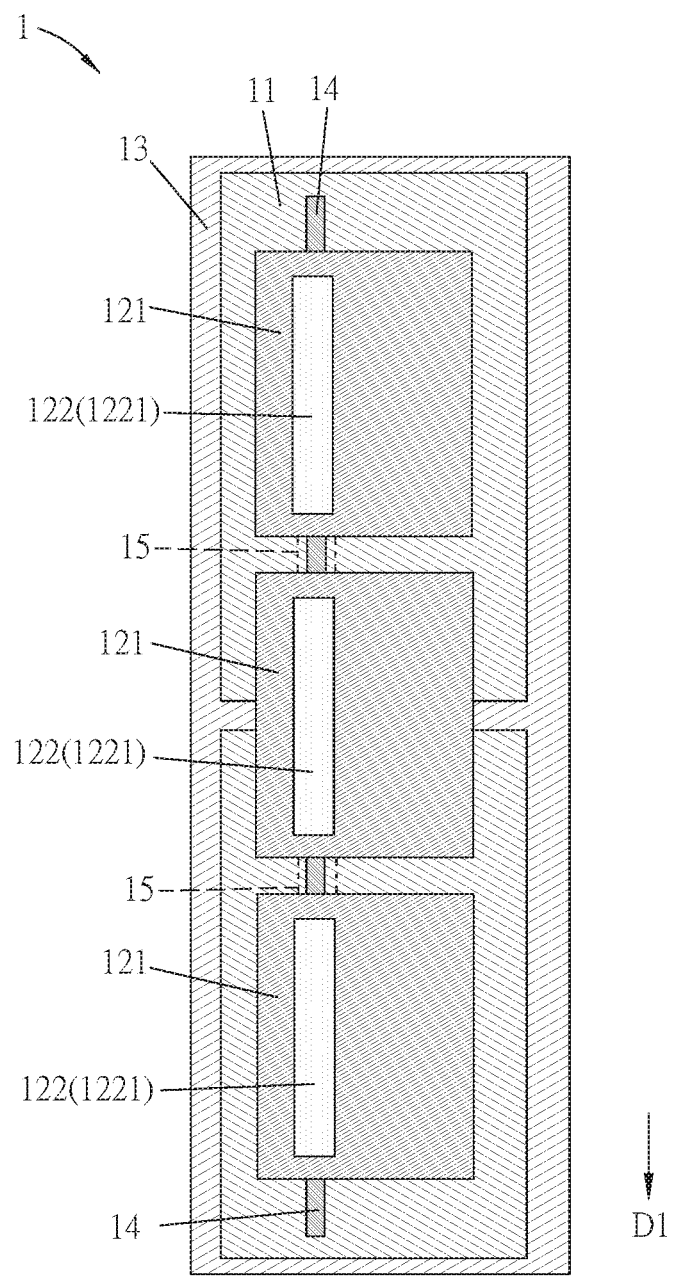
FIGS. 1C and 1D are schematic diagrams showing different configurations of the electronic device of FIG. 1A.
Figure 1D:
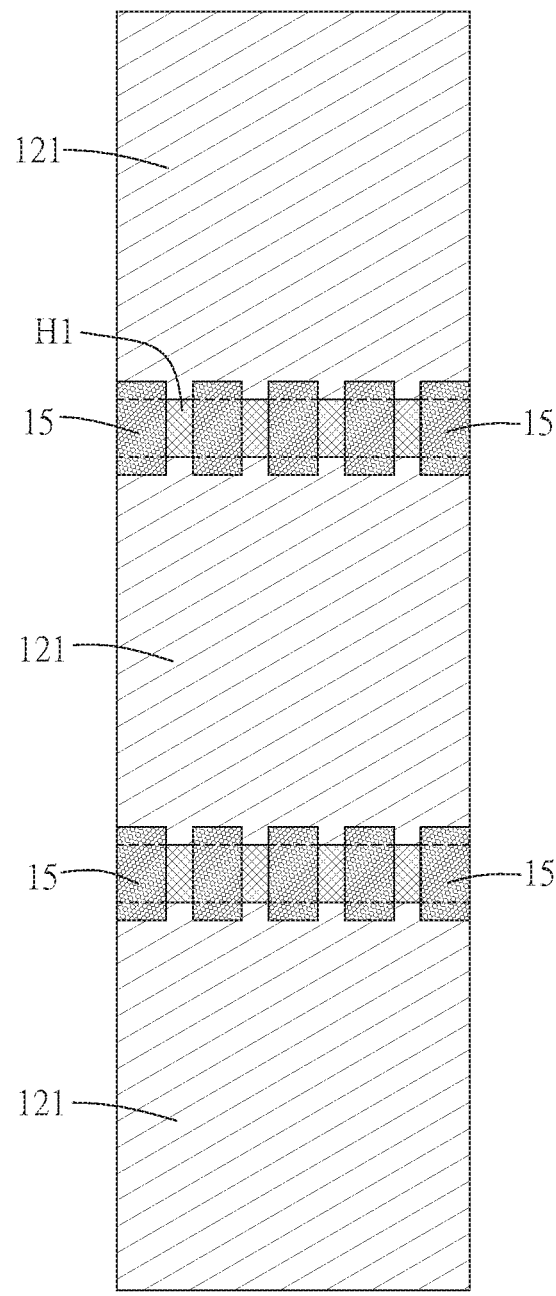

FIG. 1A is a schematic diagram showing an electronic device according to an embodiment of this disclosure, FIG. 1B is a block diagram showing the driving units and photoelectric structures in the electronic device according to the embodiment of this disclosure, and FIGS. 1C and 1D are schematic diagrams showing different configurations of the electronic device of FIG. 1A.

Referring to FIGS. 1A and 1B, the electronic device 1 of this embodiment comprises a plurality of first substrates 11, a plurality of photoelectric structures 12, at least one third substrate 13, a plurality of driving units 17, a plurality of conductive layers 14, and a plurality of first conductive structures 15. The photoelectric structures 12 are arranged in coplanar and disposed on the first substrates 11. The at least one third substrate 13 is connected to the first substrates 11 or the photoelectric structures 12. To be noted, FIG. 1A shows merely one third substrate 13. The driving units 17 are distributed on the first substrates 11 or the photoelectric structures 12 (FIG. 1B shows merely one driving unit 17). The conductive layers 14 are distributed on the first substrates 11, respectively. The optoelectronic structures 12 are electrically connected to the conductive layers 14 via the first conductive structures 15, respectively.

The first substrates 11 are arranged in coplanar in a first direction D1 along a predefined plane which is virtually defined. In some cases, the predefined plane could be a solid plane on one article. The photoelectric structures 12 are also arranged in coplanar in the first direction D1 and disposed on the first substrates 11. With reference to FIGS. 1A and 1C, each photoelectric structure 12 comprises a second substrate 121, a signal layer 122, and at least one photoelectric component 123. The signal layer 122 is distributed on the second substrate 121 and comprises at least one signal line 1221. The at least one photoelectric component 123 is disposed on the second substrate 121 and electrically connected to the signal line 1221. Thus, a signal or signals can be transmitted to the at least one photoelectric component 123 through the signal line 1221 of the signal layer 122.

In this embodiment, the electronic device 1 comprises three photoelectric structures 12 (and three second substrates 121 thereof), and each photoelectric structure 12 comprises four photoelectric components 123, but this disclosure is not limited thereto. In other embodiments, the amount of the photoelectric structures 12 can be more than 3, and the amount of the photoelectric components 123 can be less than or greater than 4. Among the three photoelectric structures 12, one of the photoelectric structures 12 straddles adjacent two of the first substrates 11 in the first direction D1. In this case, the three second substrates 121 are disposed on the first substrate 11 by an adhesion layer H (e.g., for example but not limited to, OCA), and the middle one of the three photoelectric structures 12 (and the second substrate 121 corresponding thereto) straddles adjacent two first substrates 11.

In some embodiments, the photoelectric component 123 of each photoelectric structure 12 can comprise at least one photoelectric chip, thermoelectric chip, piezoelectric chip, or sensing chip. The photoelectric chip can comprise, for example but not limited to, an LED chip, a micro LED chip, or any of other photoelectric chips. The sensing chip can comprise an IR sensing chip, an ultrasonic sensing chip, a thermal sensing chip, or an image sensor, and this disclosure is not limited. In some embodiments, the photoelectric component 123 can comprise, for example, a red, blue or green LED or micro LED for forming a full-color LED display device or micro LED display device.

In some embodiments, a plurality of photoelectric structures 12 can be arranged, based on the requirements, in a row, a column, an array (columns and rows), or a polygon. In some embodiments, a plurality of photoelectric structures 12 can construct a matrix with rows and columns, thereby forming an AM (active-matrix) electronic device such as, for example but not limited to, an AM LED display device, an AM micro LED display device, an AM sensor array, an AM antenna array, an AM laser array, an AM projector array, or an AM millimeter wave radar array.

The third substrate 13 is connected to the first substrates 11 or the photoelectric structures 12. When the third substrate 13 is connected to the first substrates 11, the third substrate 13 is functioned as a carrier substrate. When the third substrate 13 is connected to the photoelectric structures 12, the third substrate 13 is functioned as a protective substrate or a protective film. In this embodiment, the third substrate 13 is functioned as a carrier substrate for example. The third substrate 13 can connect to and support two first substrates 11 through another adhesion layer H such as, for example but not limited to, an OCA.

The first substrates 11, the second substrates 121 or the third substrate 13 can be rigid or flexible optionally, such as be made of glass, resin, metal, ceramics, or composite materials. The resin material is a flexible material, and may comprise organic polymer material. The glass transition temperature (Tg) of the organic polymer material is, for example, between 250° C. and 600° C., and preferably between 300° C. and 500° C. Since the organic polymer material has a relative higher glass transition temperature, the driving elements (e.g. TFTs), signal layers, conductive layers, conductive structures or wires can be directly formed on the flexible substrate by, for example, a thin-film manufacturing process. The organic polymer material can be a thermoplastic material, such as polyimide (PI), polyethylene (PE), polyvinylchloride (PVC), polystyrene (PS), acrylic, fluoropolymer, polyester, or nylon. In some embodiments, the material of the first substrates 11, the second substrates 12 or the third substrate 13 can be, for example, PI. Since the first substrates 11, the second substrates 12 and the third substrate 13 are flexible substrates, the entire electronic device 1 can be a flexible product. In some embodiments, in order to form the additional layers or components on the flexible substrates (e.g. the first substrates 11, the second substrates 12, and/or the third substrate 13), each of the flexible substrates can be temporarily attached to a rigid substrate (e.g. a glass substrate) before performing the following manufacturing processes. Afterwards, the rigid substrates can be removed before bonding the different flexible substrates.

The plurality of driving units 17 can be distributed on the first substrates 11 or the photoelectric structures 12, and the driving units 17 correspondingly drive the photoelectric components 123 of the photoelectric structures 12 (see FIG. 1B). In this embodiment, each driving unit 17 can comprise at least one thin-film transistor (TFT). In this embodiment, the amount of the driving units 17 corresponds to the amount of the photoelectric components 123, so that the driving units 17 can correspondingly drive the photoelectric components 123, for example but not limited thereto, in a one-on-one manner. In some embodiments, each driving unit 17 may further comprise other thin-film components or wires, such as thin-film resistors, capacitors or insulating layers.

The plurality of conductive layers 14 are distributed on the first substrates 11, respectively. The optoelectronic structures 12 are electrically connected to the conductive layers 14 via the first conductive structures 15, respectively. In this embodiment, the first conductive structure 15 is located between adjacent two second substrates 121 and contacts for electrical connection between the signal layers 122 (signal lines 1221) of the adjacent two second substrates 121. In addition, the first conductive structure 15 also reaches the conductive layer 14 of the first substrate 11 for electrical connection. Accordingly, the photoelectric component 123 of the photoelectric structure 12 can be electrically connected to the conductive layer 14 of the first substrate 11 through the signal layer 122 and the corresponding first conductive structure 15, so that the signals transmitted to the conductive layer 14 can be further transmitted to the corresponding photoelectric component 123 through the corresponding first conductive structure 15 and the signal layer 122 (with the signal line 1221 thereof) of the photoelectric structure 12. In some embodiments, when a plurality of driving units 17 are distributed on the first substrates 11, the driving units 17 can drives the photoelectric components 123 of the corresponding photoelectric structures 12, respectively, through the conductive layer 14 on the first substrate 11, the corresponding first conductive structure 15 and the signal layer 122 (with the signal line 1221 thereof) of the corresponding photoelectric structure 12. In some embodiments, when a plurality of driving units 17 are distributed on the second substrates 121 of the photoelectric structures 12, the driving units 17 can drives the photoelectric components 123, respectively, through the signal layers 122 (with signal lines 1221 thereof) of the corresponding photoelectric structures 12. Accordingly, the application of the electronic device according to this disclosure is very flexible. To be noted, the amount of the first conductive structures 15 in the electronic device 1 can be modified based on the requirement. For example, it is possible to configure at least one first conductive structure 15 to electrically connect to the corresponding photoelectric structure 12 and the conductive layer 122. Optionally, as shown in the embodiment of FIG. 1D, a plurality of first conductive structures 15 are disposed between adjacent two photoelectric structures 12 (with second substrates 121 thereof). In addition, the electronic device 1 can further comprise a plurality of first flexible members H1 filled among the first conductive structures 15 between the adjacent two photoelectric structures 12. The first flexible members H1 can be made of the anti-vibration, pressure-absorption, and/or tensile-plasticity material (e.g., for example but not limited to, epoxy). Moreover, the first flexible members H1 can also protect the first conductive structures 15.

Referring to FIG. 1A, each first conductive structure 15 of this embodiment can further comprise a conductive pillar 151 and a conductive material 152. The conductive pillar 151 is disposed on the corresponding first substrate 11, electrically connected to the conductive layer 14 of the corresponding first substrate 11, and located between adjacent two photoelectric structures 12. The conductive material 152 covers the conductive pillar 151, and electrically connects to the signal layers 122 of two adjacent photoelectric structures 12. In this embodiment, the conductive pillar 151 can be, for example, a Sn bump, a Cu bump, or an Au bump, and the conductive material 152 can be formed by the solidification of the material such as, for example but not limited to, the Cu paste, Ag paste, Sn paste, or ACP. The difference between the conductive pillar 151 and the conductive material 152 is in that the conductive material 152 is for fitting the shape of the space, while the conductive pillar 151 is for supporting the conductive material 152. The conductive pillar 151 and conductive material 152 can be made of the same or different materials. The conductive material 152, for example but not limited thereto, covers the conductive pillar 151 and fits between the adjacent two photoelectric structures 12 for electrical connection. The conductive pillar 151 of this embodiment tapers off (for example but not limited thereto, a corn shape) in a direction toward the photoelectric structures 12 and supports the conductive material 152. Of course, in other embodiments, the conductive pillar 151 can be a cylindrical shape or a straight sleeve shape instead of the above-mentioned gradually narrowed shape. In other embodiments, the first conductive structure 15 can comprise the conductive material 152 only (without conductive pillar 151) for electrically connecting the signal layers 122 of two adjacent photoelectric structures 12, and the conductive material 152 is electrically connected to the photoelectric structure 12 and the corresponding conductive layer 14.

In addition, the electronic device 1 of this embodiment can further comprise a light-shielding layer S and a solder mask layer R. The configuration of the light-shielding layer S can improve the contrast of the electronic device 1, and the material of the light-shielding layer S can be the same as the material of the black matrix (BM). The light-shielding layer S can be disposed on each signal layer 122 and each first conductive structure 15 and located between the photoelectric components 123. The light-shielding layer S can also be provided on the periphery of the electronic device 1. In addition, the solder mask layer R is disposed on the first substrates 11 and located between the conductive layers 14. The solder mask layer R is used to define the patterns of the conductive layers 14 and also provide the function of planarization, so that the second substrate 121 can be smoothly connected to the first substrate 11 through the adhesion layer H and the solder mask layer R.

As mentioned above, the electronic device 1 of this disclosure can provide a flexible design in electricity and (crossingly) electrical connection to satisfy the requirements of users due to the configurations and connection design of a plurality of first substrates 11, a plurality of photoelectric structures 12, at least one third substrate 13, a plurality of driving units 17, a plurality of conductive layers 14, and a plurality of first conductive structures 15. Accordingly, the user can design different signal transmissions for different products based on the various product requirements.

For example, regarding the signal transmission in some applications, the driving unit 17 can transmit the signal for driving the photoelectric component 123 through the photoelectric structure 12 straddling two adjacent first substrates 11 based on various configurations and connection design of the electronic device 1. The signal can be transmitted from the conductive layer 14 on the first substrate 11 (e.g. the left first substrate 11 of FIG. 1A) of the two adjacent first substrates 11 to another conductive layer 14 on the other first substrate 11 of the two adjacent first substrates 11 (e.g. the right first substrate 11 of FIG. 1A) through the signal lines 1221 of one or more photoelectric structures 12 and the first conductive structures 15 in relation to the one or more photoelectric structures 12, therefore the signal is capable of transmitting from the left first substrate 11 to the right first substrate 11 thorough the straddling one or ones of the photoelectric structures 12 (and the first conductive structures 15 corresponding thereto) to drive the photoelectric component 123 of the corresponding photoelectric structure 12 on the right first substrate 11.

Figure 2A:
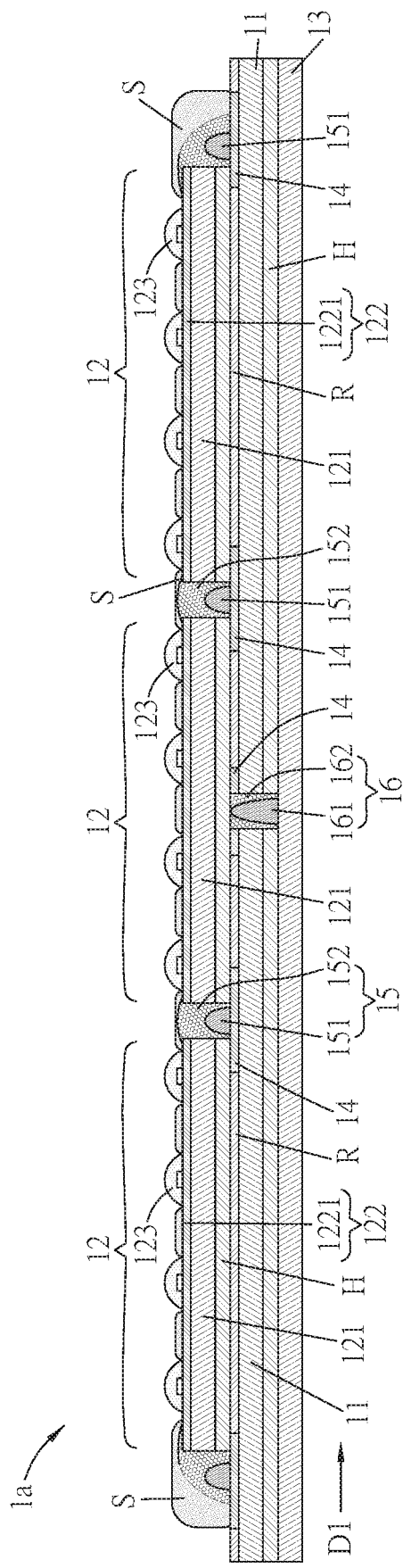

FIG. 2A is a schematic diagram showing an electronic device 1a according to a different embodiment of this disclosure. Different from the electronic device 1 of FIG. 1A, the electronic device 1a of this embodiment further comprises at least one second conductive structure 16. For example, FIG. 2A shows that the electronic device 1a comprises one second conductive structure 16. The second conductive structure 16 is disposed on the third substrate 13 and extends in a direction from the third substrate 13 to the photoelectric structure 12. To be noted, the configuration of the second conductive structure 16 is similar to that of the first conductive structure 15. That is, at least one second conductive structure can be configured between adjacent two first substrates 11. In other words, the conductive layers 14 on two first substrate 11 can be electrically connected to each other through at least one second conductive structure 16. Thus, the signal transmitted to the conductive layer 14 on one first substrate 11 of the two adjacent first substrates 11 can be further transmitted to the conductive layer 14 on the other first substrate 11 of the two adjacent first substrates 11 through the second conductive structure 16. In addition, when a plurality of second conductive structures 16 are configured between two adjacent first substrates 11, the plurality of second conductive structures 16 can be electrically connected to the conductive layers 14 on the adjacent two first substrates 11. Moreover, similar to the case of FIG. 1D, a plurality of second flexible members can be filled between the adjacent two second conductive structures 16 between the two adjacent first substrates 11 for providing the ability of anti-vibration, pressure absorption, and/or tensile plasticity; the second flexible members can also protect the second conductive structures 16.

In this embodiment, each second conductive structure 16 also comprises a conductive pillar 161 and a conductive material 162. The conductive pillar 161 is disposed on the third substrate 13, and located between adjacent two first substrates 11. The conductive material 162 covers the conductive pillar 161, and electrically connects to the conductive layers 14 on two adjacent first substrates 11. The conductive pillar 161 and conductive material 162 can be made of the same or different materials. In this embodiment, the conductive pillar 161 tapers off in a direction toward the photoelectric structures 12. Of course, in other embodiments, the conductive pillar 161 can be a cylindrical shape or a straight sleeve shape instead of the above-mentioned gradually narrowed shape. In other embodiments, the second conductive structure 16 can comprise the conductive material 162 only (without conductive pillar 161) for electrically connecting the conductive layers 14 on two first substrates 11.

As mentioned above, regarding the signal transmission in some applications, the driving units 17 for driving the photoelectric component 123 can be disposed on the first substrates 11. Based on the design requirement of the user, the signal can be transmitted from the conductive layer 14 on one of the adjacent two first substrates 11 to the conductive layer 14 on the other one of the adjacent two first substrates 11 through the first conductive structure 15 with or without the second conductive structure 16 for driving the photoelectric component 123 of the corresponding photoelectric structure 12 on the other one of the adjacent two first substrate 11. The above-mentioned signal transmission is an illustration only, and it can also be applied to the following embodiments.

Figure 2B:
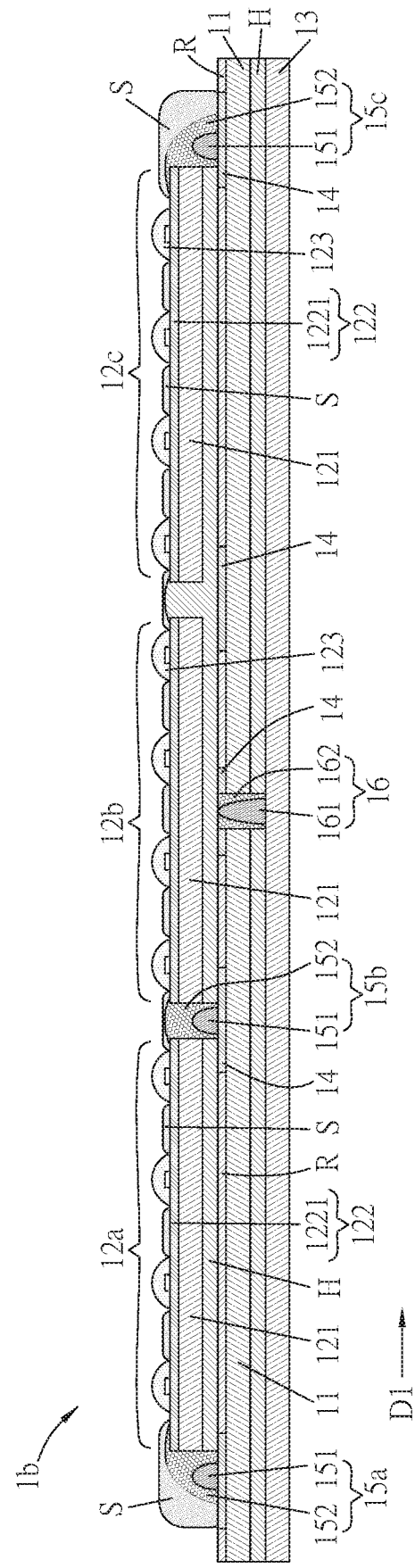

FIG. 2B is a schematic diagram showing an electronic device 1b according to a different embodiment of this disclosure. Different from the electronic device 1a of FIG. 2A, one of the second conductive structures 16 can be configured to provide the electrical connection function for replacing the photoelectric structure 12b straddling the adjacent two first substrates 11. In the electronic device 1b of this embodiment, two sides of (the leftmost one of) the photoelectric structure 12a on the (left) first substrate 11 are electrically connected to the corresponding conductive layers 14 through the first conductive structures 15a and 15b, respectively. Besides, the photoelectric structures 12a and 12b are electrically connected to each other through the first conductive structure 15b and then further electrically connected to the above-mentioned conductive layer 14. The space between the photoelectric structures 12b and 12c on the (right) first substrate 11 is not configured with the first conductive structure, and (the right side of) the photoelectric structure 12c is electrically connected to the corresponding conductive layer 14 through another first conductive structure 15c. Accordingly, the signal can be transmitted from the conductive layer 14 on the (left) first substrate 11 to the conductive layer 14 on the (right) first substrate 11 through the second conductive structure 16 only for driving the photoelectric component 123 of the corresponding photoelectric structure 12c.

Figure 3:
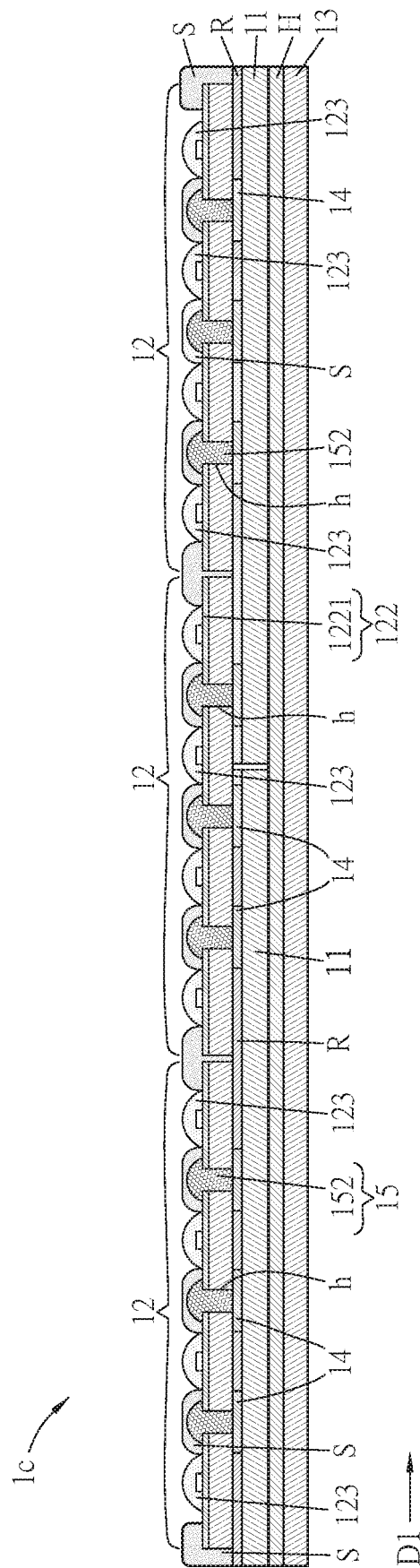

FIG. 3 is a schematic diagram showing an electronic device 1c according to a different embodiment of this disclosure. The component configuration and connection of the electronic device 1c of this embodiment are mostly the same as those of the electronic device 1 of the previous embodiment. Different from the electronic device 1, the first conductive structures 15 of the electronic device 1c are disposed at the inner of the photoelectric structures 12 (with through holes formed on the second substrates 121 thereof) instead of at the position between the two photoelectric structures 12 (with two second substrates 121 thereof). The inner of each second substrate 121 is configured with a plurality of through holes h, and the first conductive structures 15 are disposed in the through holes h, respectively. In addition, one of the first conductive structures 15 is located between adjacent two photoelectric components 123, and the first conductive structure 15 is electrically connected to the adjacent two photoelectric components 123, the signal layer 122 of the corresponding second substrate 121, and the corresponding conductive layer 14 on the first substrate 11. Moreover, the first conductive structure 15 of this embodiment comprises merely the conductive material 152 filled in the through hole h for electrically connecting the corresponding photoelectric structure 12 and the corresponding conductive layer 14. Of course, in other embodiments, the first conductive structure 15 may comprise the conductive pillar 151 and the conductive material 152, as mentioned above.

In addition, the space between the two adjacent first substrates 11 is not configured with any second conductive structure(s) in this embodiment. Of course, in other embodiments, it is possible to configure the above-mentioned one or more second conductive structures 16 between two first substrates 11.

Figure 4A:
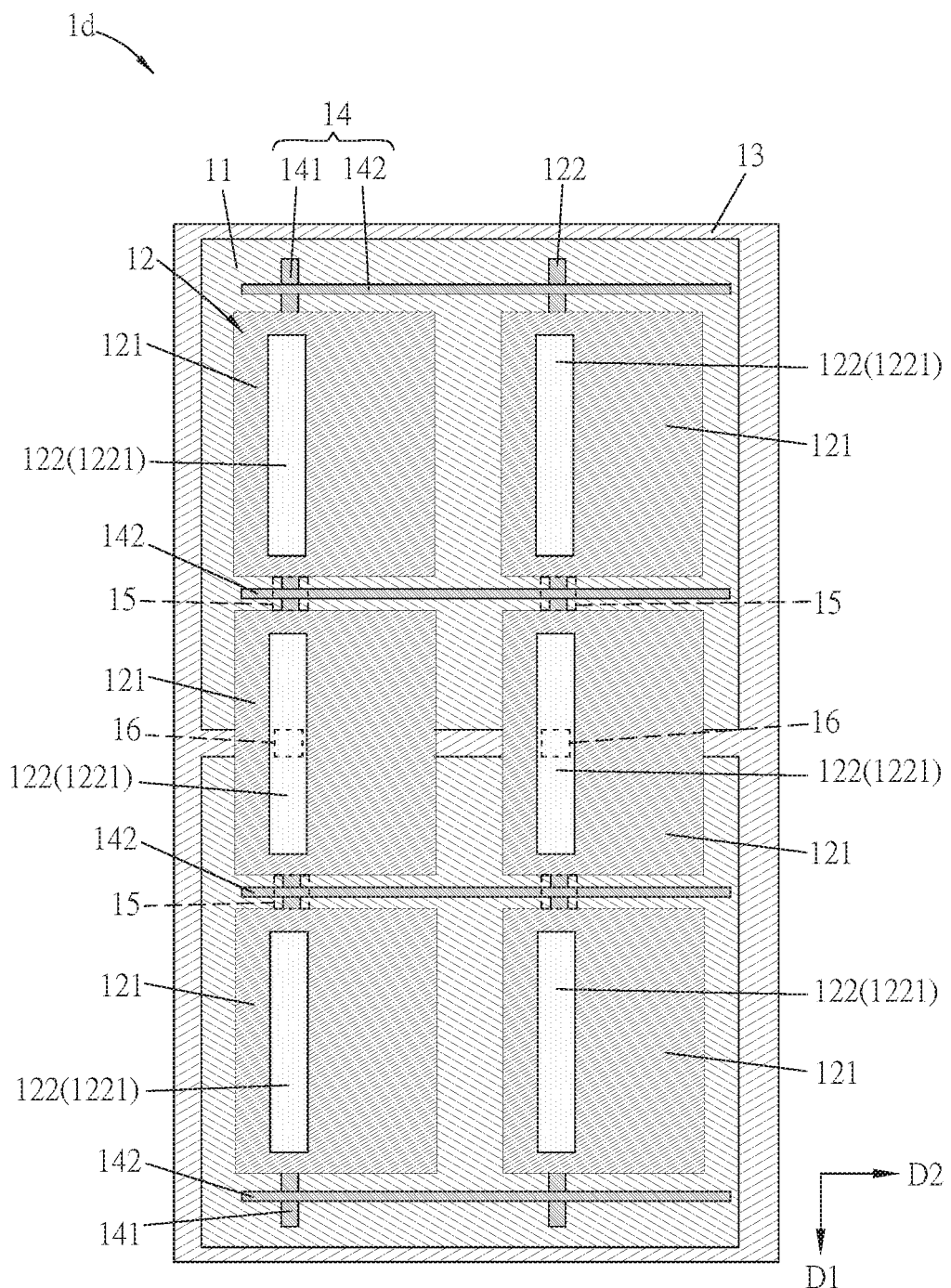
Figure 4B:
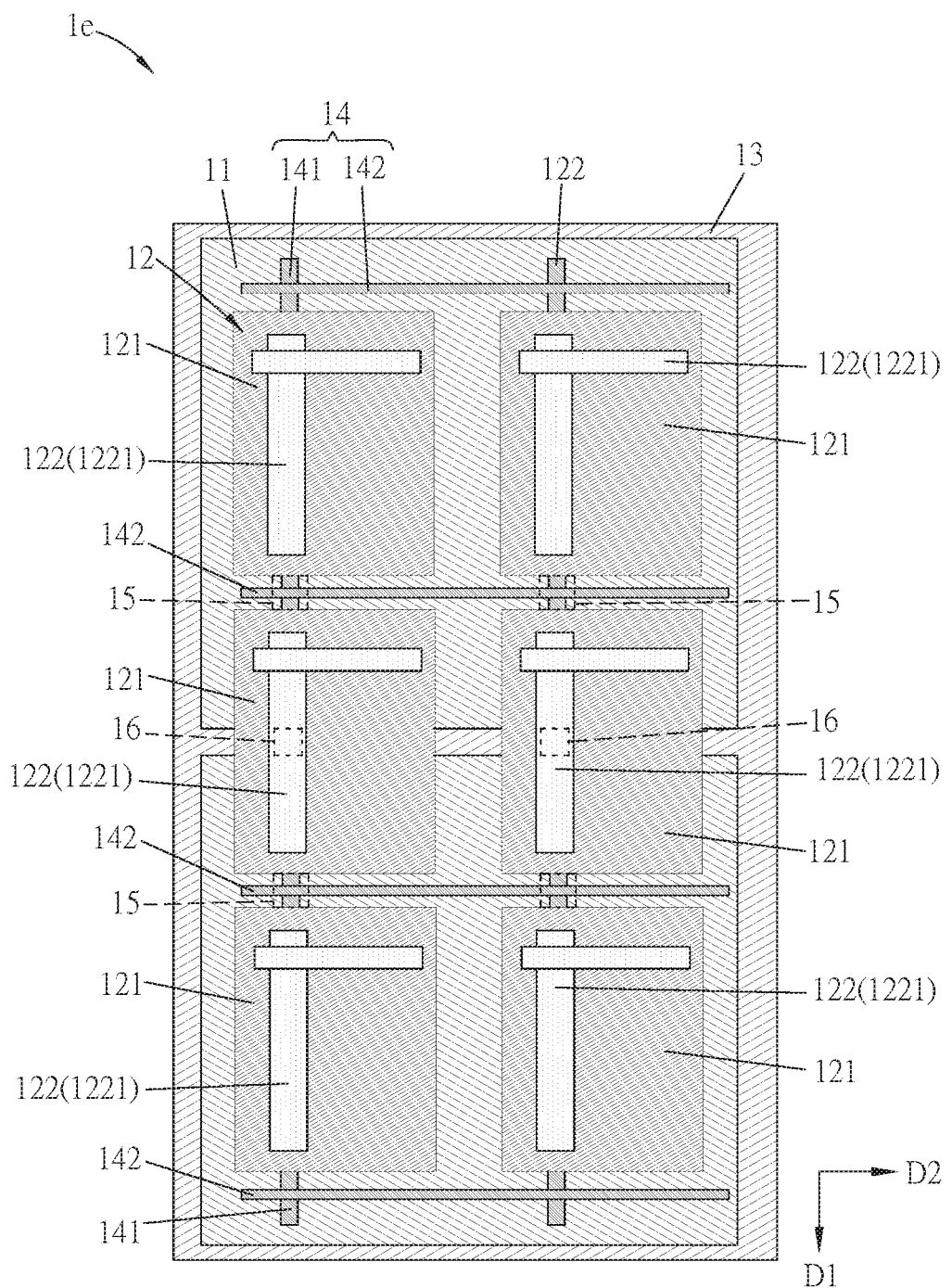
Figure 4C:
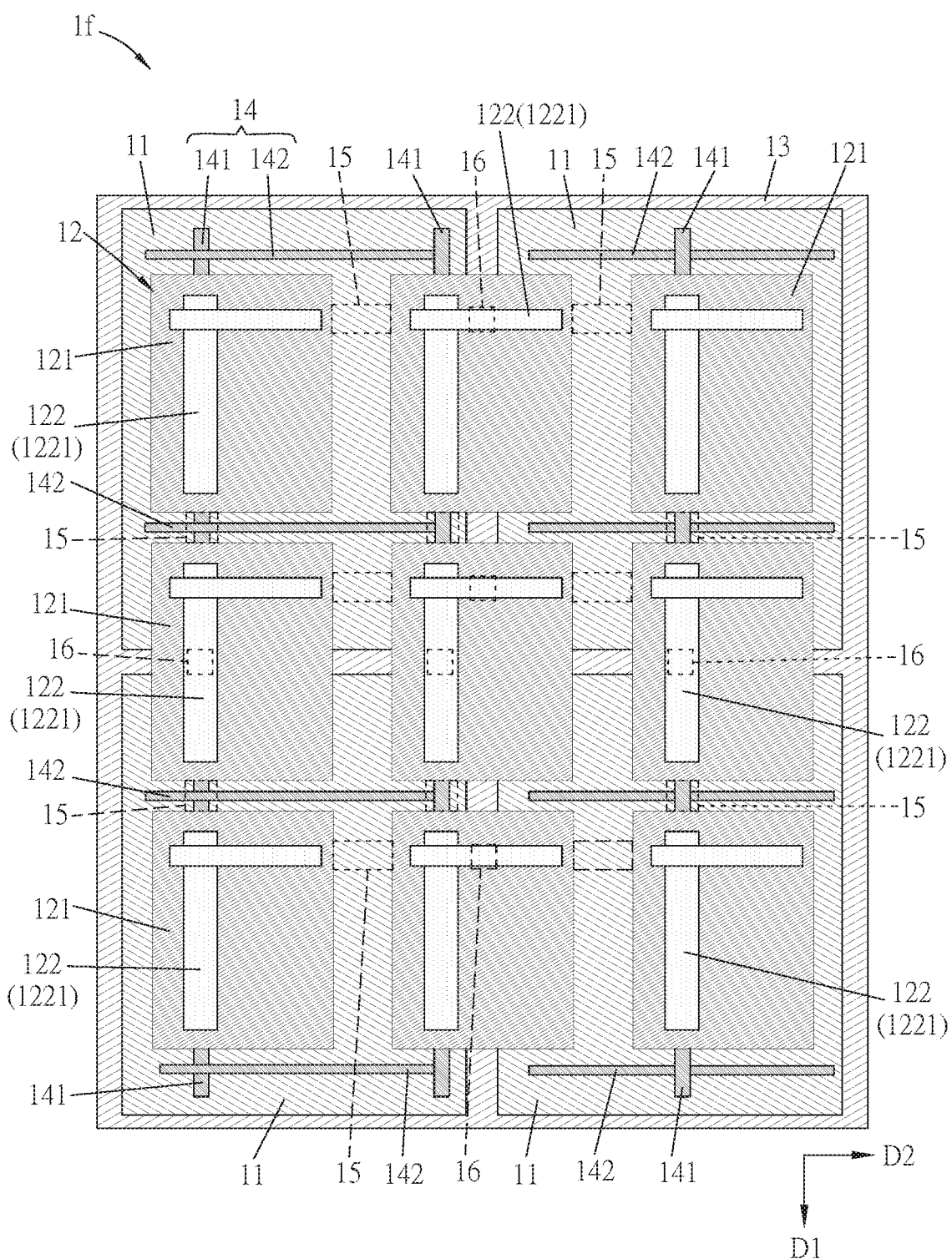

FIGS. 4A to 4C are schematic diagrams showing the electronic devices 1d, 1e and 1f according to different embodiments of this disclosure. The electronic devices 1d, 1e and 1f of FIGS. 4A to 4C can comprise the components and technical contents of any of the above-mentioned electronic devices 1, 1a, 1b and 1c. To be noted, FIGS. 4A to 4C only show the relative positions of the first substrate 11, the second substrate 121 and the signal layer 122 of the photoelectric structure 12, the conductive layer 14, the first conductive structure 15, the second conductive structure 16, and the third substrate 13, but not show the other components (e.g. the photoelectric components 123, the driving units 17, the adhesion layer H, the light-shielding layer S, the solder mask layer R, etc.) of the electronic device 1 and the electrical connections of all components. Herein, the signal layer 122 in FIG. 4A comprises the signal line 1221 extending in the first direction D1, and the signal layer 122 in FIG. 4B or 4C comprises the signal line 1221 extending in the first direction D1 and the signal line 1221 extending in the second direction D2. The conductive layer 14 comprises the first wire 141 extending in the first direction D1 and the second wire 142 extending in the second direction D2. The first conductive structure 15 and the second conductive structure 16 are shown by dotted lines.

In the electronic device 1d of FIG. 4A, each of the first substrates 11 is further defined with a second direction D2 perpendicular to the first direction D1 along the predefined plane, and some of the photoelectric structures 12 are arranged in the second direction D2 and disposed on the first substrates 11. In this embodiment, the photoelectric structures 12 are arranged in an array (rows and columns). In addition, the conductive layer 14 on the first substrate 11 is defined with a first wire 141 extending in the first direction D1 and a second wire 142 perpendicular to the first wire 141 (the second wire 142 extends in the second direction D2). Herein, the above-mentioned predefined plane is a plane defined by the first direction D1 and the second direction D2.

With reference to FIG. 4A in view of FIG. 2A, regarding the signal transmission in the case of the electronic device 1d in some applications, the signal (for driving the photoelectric component 123) can be transmitted from the first wire 141 of the conductive layer 14 on one of the adjacent two first substrates 11 to the conductive layer 14 on the other one of the adjacent two first substrates 11 in the first direction D1, through the signal line 1221 of one photoelectric structure 12, which straddles the adjacent two first substrates 11, and through the corresponding ones of the first conductive structures 15 in relation thereto. In other words, the signal can be crossingly transmitted from one first substrate 11 to another (adjacent one) first substrate 11 in the first direction D1 so as to drive a next one photoelectric component 123 of the photoelectric structure 12 corresponding to the other (adjacent one) first substrate 11 of the adjacent two first substrates 11.

With reference to FIG. 4B, regarding the electronic device 1e in some applications, each of the first substrates 11 is further defined with a second direction D2 perpendicular to the first direction D1 along the predefined plane. Some of the photoelectric structures 12 are arranged in the first direction D1, some of the photoelectric structures 12 are arranged in the second direction D2, and they are disposed on the same first substrate 11. In addition, the conductive layer 14 of this embodiment is also defined with a first wire 141 extending in the first direction D1 and a second wire 142 perpendicular to the first wire 141. The photoelectric structure 12 comprises both of the signal lines 1221 extending in the first direction D1 and the signal lines 1221 extending in the second direction D2. In this disclosure, the designated number for signal lines, no matter extending in the first or second directions D1, D2, are given as number 1221.

Regarding the signal transmission of the electronic device 1e, an additional signal can be provided and transmitted from the first wire 141 of the conductive layer 14 on one of the adjacent two first substrates 11 to the first wire 141 of the conductive layer 14 on the other one of the adjacent two first substrates 11 in the first direction D1, through the signal line 1221 of (middle) one photoelectric structure 12 straddling the adjacent two first substrates 11, and through ones of the first conductive structures 15 in relation thereto. In other words, the additional signal is crossingly transmitted from one first substrate 11 (upper first substrate 11) to the adjacent first substrate 11 (lower first substrate 11) in the first direction D1 by the one photoelectric structure 12 (left middle photoelectric structure 12) straddling the adjacent two first substrates 11 (and the first conductive structures 15 thereof), so as to be capable of driving the photoelectric component 123 of the corresponding photoelectric structure 12 (left lowermost photoelectric structure 12) on the adjacent first substrate 11 (lower first substrate 11). Moreover, on the same first substrate 11 (lower first substrate 11), the other one of the adjacent two first substrates 11, the additional signal can be further transmitted to the signal line 1221 of the next photoelectric structure 12 (right lowermost photoelectric structure 12) on the same first substrate 11 (lower first substrate 11) in the second direction D2 through the signal line 1221 of the photoelectric structure 12. In the case, the additional signal can be further transmitted to the signal line 1221 of the right lowermost photoelectric structure 12 on the same first substrate 11 (lower first substrate 11) in the second direction D2, through the signal line 1221 of the photoelectric structure 12, and through the second wire 142 of the conductive layer 14 electrically connected to the first wire 141 without any conductive structures. Alternatively, in another case of this embodiment, the additional signal can be further transmitted to the signal line 1221 of the right lowermost photoelectric structure 12 on the same first substrate 11 (lower first substrate 11) in the second direction D2, through the signal line 1221 of the photoelectric structure 12, and through one or more of the first conductive structures (not shown) between adjacent two photoelectric structures 12 (right and left lowermost photoelectric structures 12) on the same first substrate 11 (lower first substrate 11). In other words, the same signal can be transmitted from one photoelectric structure 12 on one first substrate 11 to the next photoelectric structure 12 on the same first substrate 11 in the second direction D2 for driving the photoelectric component 123 of the next photoelectric structure 12 on the same first substrate 11. To be noted, this application is applied to the single-layer first substrate 11, which means that the first wire 141 and the second wire 142 of the conductive layer 14 are configured in the same layer of the first substrate 11.

With reference to FIG. 4C, regarding the electronic device 1f in some applications, each of the first substrates 11 is further defined with a second direction D2 perpendicular to the first direction D1 along the predefined plane. Some of the photoelectric structures 12 are arranged in the first direction D1; some of the photoelectric structures 12 are arranged in the second direction D2 and disposed on different first substrates 11. In this embodiment, some photoelectric structures straddle the first substrates 11 in the first direction D1, and some straddles the first substrates 11 in the second direction D2. In addition, the conductive layer 14 of this embodiment is also defined with a first wire 141 extending in the first direction D1 and a second wire 142 perpendicular to the first wire 141. The photoelectric structure 12 comprises both of the signal lines 1221 extending in the first direction D1 and the signal lines 1221 extending in the second direction D2.

Regarding the signal transmission of the electronic device 1f, in this case, the term "adjacent ones of the first substrate 11" at least comprises adjacent three first substrate 11, in which a first group of adjacent two first substrates 11 are arranged in the first direction D1, and a second group of adjacent two first substrates 11 are arranged in the second direction D2. An additional signal can be provided and transmitted from the first wire 141 of the conductive layer 14 on one first substrate 11 of the first group of adjacent two first substrates 11 to the first wire 141 of the conductive layer 14 on the other one first substrate 11 of the first group of adjacent two first substrates 11 in the first direction D1, through the signal line 1221 of one photoelectric structure 12 (left middle photoelectric structure 12) straddling the adjacent two first substrates 11 of the first group in the first direction D1, and through the corresponding one or ones of the first conductive structures 15 in relation thereto. In other words, the additional signal is crossingly transmitted from one first substrate 11 (left upper first substrate 11) to the adjacent first substrate 11 (left lower first substrate 11) in the first direction D1 so as to be capable of driving the photoelectric component 123 of the corresponding photoelectric structure 12 (left lowermost photoelectric structure 12) on the adjacent first substrates 11 (left lower first substrate 11). Moreover, the additional signal can be further transmitted to the signal line 1221 of a photoelectric structure 12 on the next first substrate 11 (right lower first substrate 11) in the second direction through the signal line 1221 of an additional photoelectric structure 12 (middle lowermost photoelectric structure 12) straddling the adjacent first substrates 11 of the second group in the second direction D2, and through the first conductive structures 15 in relation to the additional photoelectric structure 12 (middle lowermost photoelectric structure 12). In other words, the same signal can be further transmitted from one photoelectric structure 12 (leftmost lowermost photoelectric structure 12) on one first substrate 11 (left lower first substrate 11), which is the other one first substrate 11 of the first group of adjacent two first substrates 11 and also is one first substrate 11 of the second group of adjacent two first substrates 11 in this case, to a next one photoelectric structure 12 (rightmost lowermost photoelectric structure 12) on the next first substrate 11 (right lower first substrate 11) in the second direction D2 so as to be capable of driving the photoelectric component 123 of the corresponding photoelectric structure 12 (rightmost lowermost photoelectric structure 12) on the next first substrate 11 (right lower first substrate 11). To be noted, this application can be applied to the multilayer first substrate 11, which means that the first wire 141 and the second wire 142 of the conductive layer 14 are configured in different layers of the first substrate 11.

Regarding an electronic device with the second conductive structures 16, the signal for driving the photoelectric components 123 can be transmitted from the conductive layer 14 on one first substrate 11 to one or more photoelectric structures 12 on the next first substrate 11 through the corresponding second conductive structures 16 in the first or second direction D1, D2. In other words, the signal can be transmitted from the conductive layer 14 on one first substrate 11 to one or more photoelectric structures 12 on the next first substrate 11 through the corresponding second conductive structures 16, respectively, in the first or second direction D1, D2.

In the above applications, the driving units 17 for driving the photoelectric components 123 can be disposed on the first substrates 11. Of course, the driving units 17 for driving the photoelectric components 123 can be disposed on the photoelectric structures 12, respectively, for driving the corresponding photoelectric components 123.

FIGS. 5A to 5D are schematic diagrams showing the electronic devices 1g~1j according to different embodiments of this disclosure. The electronic devices 1g, 1h, 1i and 1j of FIGS. 5A to 5D can comprise the components and technical contents of any of the above-mentioned electronic devices 1 and 1a-1f. To be noted, FIGS. 5A to 5D only show the relative positions of the first substrate 11, the photoelectric structure 12, and the third substrate 13 in the electronic devices 1g~1j, but not show the other components of the electronic devices 1g~1j and the electrical connections of the components.

In the electronic devices 1g~1j, the region of the photoelectric structures can be defined as a display area, and the region, which is an area excluding the photoelectric structures, can be defined as a peripheral area B. For example, the peripheral area is located at the periphery of the electronic device, and at least one driving circuit can be configured in the peripheral area for driving the photoelectric structures. In this embodiment, the driving circuit can comprise at least one driving chip (driving IC). In some embodiments, the driving chip can be, for example but not limited to, a scan driving chip or a data driving chip, which is configured to drive the corresponding photoelectric structures via the driving units, respectively.

Figure 5A:
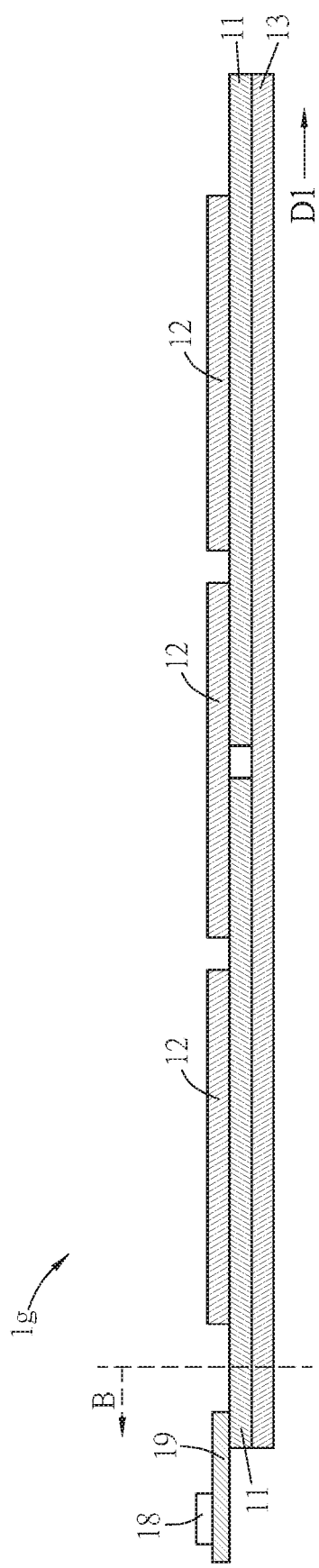

In the electronic device Ig of FIG. 5A, the peripheral area B is located around the photoelectric structures 12 and defined with a part of one first substrate 11 (the left first substrate 11) and the outer around the first substrates 11 (the left first substrate 11). In this embodiment, the peripheral area B comprises a connector board 19 connecting electrically to and extending away from the one substrate 11 (the left first substrate 11), and the driving circuit 18 is disposed on the connector board 19. Herein, the connector board 19 can be a rigid board or a flexible board. In some embodiments, the connector board 19 and the driving circuit 18 (e.g. a driving IC) can be, for example but not limited to, COF.

Figure 5B:
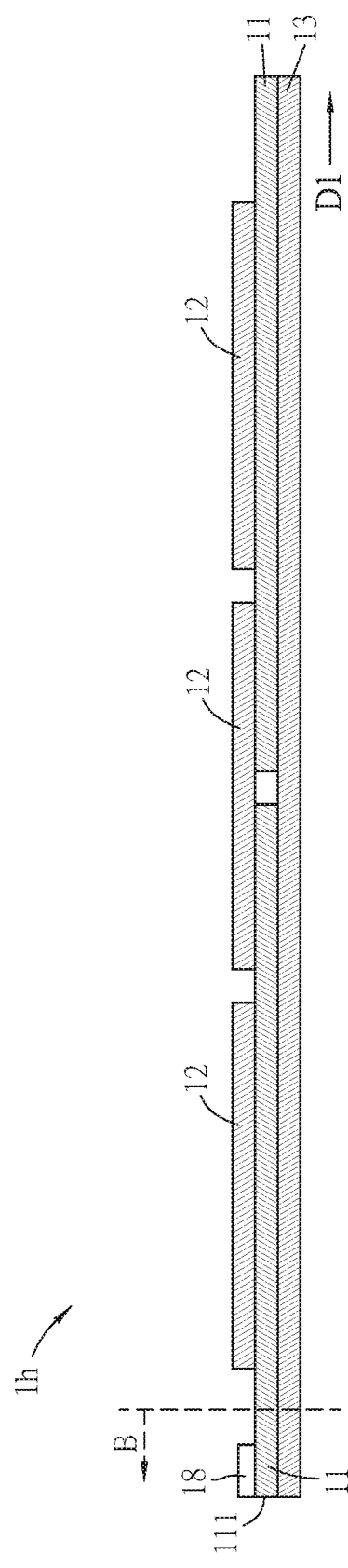

In the electronic device 1h of FIG. 5B, the peripheral area B is defined on one edge 111 of one first substrate 11 (the left first substrate 11). The driving circuit 18 (e.g. a driving IC) is disposed on the edge 111 of the first substrate 11 without the connector board (e.g. by COG).

Figure 5C:
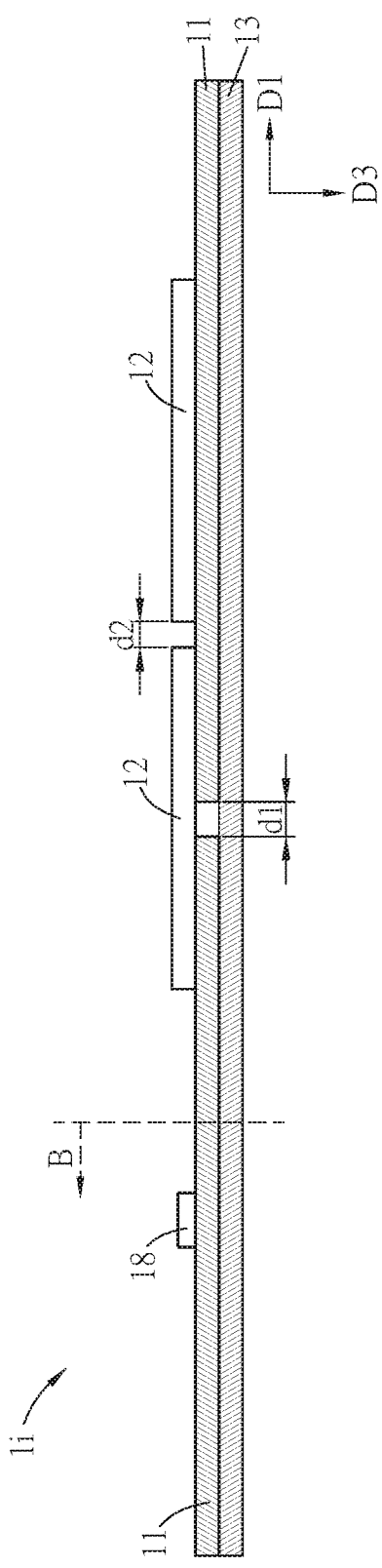

In the electronic device 1i of FIG. 5C, the peripheral area B is also defined on one first substrates 11 (the left first substrate 11), and further distributed on majority part of the one first substrate 11 (the left first substrate 11). To be noted, the left one of the first substrate 11 works as the peripheral area B only remains the photoelectric structure 12 for straddling connection.

Regarding the electronic device 1i of FIG. 5C, in some embodiments, a first gap d1 is defined between adjacent two of the first substrates 11, and a second gap d2 is defined between adjacent two of the second substrates 121 (i.e. adjacent two photoelectric structures 12). The first gap d1 and the second gap d2 are not overlapped in a vertical direction (a third direction D3) perpendicular to the predefined plane (the plane defined by the first direction D1 and the second direction D2). Based on the characteristic that the gaps between two adjacent substrates are staggered in the vertical direction, when it is needed to bend or roll the electronic device, the stress concentrated on the joints of the substrates due to bending can be dispersed. The above-mentioned feature of "the first gap d1 and the second gap d2 are not overlapped" can also be applied to any of other embodiments of this disclosure.

Figure 5D:
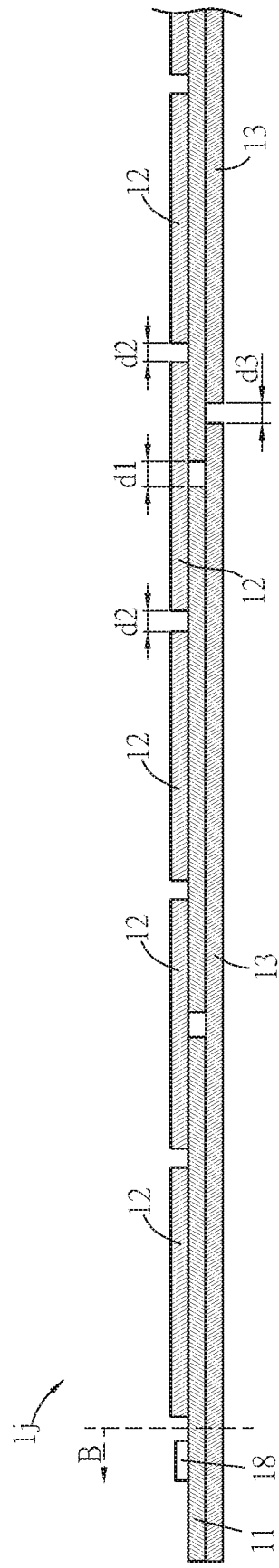

Regarding the electronic device 1j of FIG. 5D, when the electronic device 1j comprises a plurality of third substrates 13 (two third substrates 13 in this embodiment), these third substrates are also arranged in coplanar. A first gap d1 is defined between adjacent two of the first substrates 11, a second gap d2 is defined between adjacent two of the second substrates 121, and a third gap d3 is defined between adjacent two of the third substrates 13. The first gap d1, the second gap d2, and the third gap d3 are not overlapped in the vertical direction (i.e. the third direction D3). In other words, the first gap d1, the second gap d2, and the third gap d3 offset with one another in the vertical direction (i.e. the third direction D3). This configuration can prevent the break of the substrates of the electronic device 1j, thereby increasing the production yield. The above-mentioned feature of "the first gap d1, the second gap d2, and the third gap d3 are not overlapped" can also be applied to any of other embodiments of this disclosure.

FIGS. 6A and 6B are schematic diagrams showing different electronic devices according to different embodiments of this disclosure. As shown in FIG. 6A, the component configuration and connection of the electronic device 1k of this embodiment are mostly the same as those of the electronic device 1a of the above-mentioned embodiment. Different from the electronic device 1a, the third substrate 13 of the electronic device 1k is disposed above and on the photoelectric structures 12. The third substrate 13 is connected to the photoelectric structures 12 by an adhesion layer H. Accordingly, the third substrate 13 can protect the photoelectric structures 12 from the damages of external objects. In different embodiments, the third substrate 13 can cover the photoelectric structures 12 by, for example, resin transfer molding, sealing glue dispensing, or any of other suitable processes (without the adhesion layer H) for protecting the photoelectric structures 12. The technical feature of disposing the third substrate 13 above and on the photoelectric structures 12 can also be applied to any of other embodiments of this disclosure.

As shown in FIG. 6B, the component configuration and connection of the electronic device 1l of this embodiment are mostly the same as those of the electronic device 1c of the above-mentioned embodiment. Different from the electronic device 1c, the third substrate 13 of the electronic device 1l is disposed above the photoelectric structures 12, and the third substrate 13 is connected to the photoelectric structures 12 by an adhesion layer H. In addition, no second conductive structure is configured between adjacent two first substrates 11 in the electronic device 1l of this embodiment.

Of course, in other embodiments, the second conductive structure(s) can be configured between adjacent two first substrates 11. To be noted, the above-mentioned signal transmission can also be applied to the embodiments of the electronic devices 1k and 1l.

As mentioned above, the electronic device of this disclosure can provide a flexible design in electricity and (crossingly) connection according to the configuration and connection of the components, so that the users can design the desired signal transmission based on various requirements, thereby increasing the application flexibility. Regarding the conventional method of driving the photoelectric components by TFTs (e.g. driving the OLEDs to emit light by the TFTs of the TFT substrate), it is needed to design different thin-film manufacturing processes for the products with different sizes or functions individually, and the expensive TFT manufacturing processes, photomasks, substrates and/or materials are needed in these manufacturing processes. These limitations are disadvantaged to various product demands. However, this disclosure can easily utilize the combinations of different configuration and connection designs based on various requirements. Compared with the case of directly forming the electronic device on the substrate, this disclosure is advantaged of flexibility for various product requirements, and further advantaged of lower costs by saving the costs for the expensive TFT manufacturing processes, photomasks, substrates and/or materials.

In summary, the electronic device of this disclosure can provide a flexible design in electricity and (crossingly) connection to satisfy the requirements of users due to the configurations and connection design of the first substrates, the photoelectric structures, the third substrate, the driving units, the conductive layers and the first conductive structures. Accordingly, the user can design different sizes or signal transmissions for different products based on the various product requirements. In addition, this disclosure, as mentioned-above, does not need to design individual thin-film manufacturing processes for various electronic devices with different sizes or functions.

In some embodiments, when the three substrates are all flexible substrates, the whole electronic device can be flexible so as to be advantaged of bendable and/or rollable. In addition, the flexible member(s) can be further provided between the first conductive structures and the second conductive structures for protecting the first conductive structures and the second conductive structures. Moreover, the configuration of the flexible member can additionally provide the ability of anti-vibration, pressure-absorption, and/or tensile-plasticity, thereby decreasing the risk of mechanical breaking at the conjunctions among the first substrates, the second substrates for the whole electronic device.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
   a plurality of first substrates arranged in coplanar in a first direction along a predefined plane;
   a plurality of photoelectric structures arranged in coplanar in the first direction and disposed on the first substrates, wherein each of the photoelectric structures comprises a second substrate, a signal layer and a photoelectric component, the signal layer is distributed on the second substrate and comprises a signal line, the photoelectric component is disposed on the second substrate and electrically connected to the signal line, and one of the photoelectric structures straddles adjacent two of the first substrates in the first direction;
   a third substrate connected to the first substrates or the photoelectric structures;
   a plurality of driving units distributed on the first substrates or the photoelectric structures, wherein the driving units correspondingly drive the photoelectric components of the photoelectric structures, respectively;
   a plurality of conductive layers distributed on the first substrates, respectively; and
   a plurality of first conductive structures, wherein the optoelectronic structures are electrically connected to the conductive layers via the first conductive structures, respectively.

2. The electronic device of claim 1, wherein in a corresponding one of the photoelectric structures straddling the adjacent two first substrates, the signal line of the signal layer is electrically connected the conductive layers of the adjacent two first substrates via two of the first conductive structures, respectively; and
   wherein a signal is transmitted from the conductive layer on one of the adjacent two of the first substrates to the conductive layer on the other one of the adjacent two of the first substrates through the signal line or the signal lines of one or more of the photoelectric structures, and through the corresponding ones of the first conductive structures in relation thereto.

3. The electronic device of claim 1, wherein two or more of the first conductive structures are configured between the adjacent two second substrates.

4. The electronic device of claim 3, further comprising:
   a plurality of first flexible members disposed between adjacent two of the photoelectric structures, wherein the first flexible members are filled between the first conductive structures.

5. The electronic device of claim 1, wherein at least one of the first conductive structures is electrically connected to one of the photoelectric structures and one of the conductive layers in relation thereto.

6. The electronic device of claim 1, further comprising:
   a plurality of second conductive structures, wherein each of the second conductive structures is disposed between adjacent two of the first substrates and electrically connected to the conductive layers of the adjacent two first substrates.

7. The electronic device of claim 6, wherein a signal is transmitted from the conductive layer on one of the adjacent two of the first substrates to one or more of the photoelectric structures on the other one of the adjacent two of the first substrates through one or more of the second conductive structures in relation thereto.

8. The electronic device of claim 6, wherein at least one of the second conductive structures is configured between adjacent two of the first substrates.

9. The electronic device of claim 8, wherein two or more of the second conductive structures are configured between adjacent two of the first substrates, and the electronic device further comprises:
   a plurality of second flexible members disposed between the adjacent two of the first substrates, wherein the second flexible members are filled between the second conductive structures, respectively.

10. The electronic device of claim 1, wherein each of the first substrates is further defined with a second direction perpendicular to the first direction along the predefined plane, and some of the photoelectric structures are arranged in the second direction and disposed on the first substrates.

11. The electronic device of claim 1, wherein each of the first substrates is further defined with a second direction perpendicular to the first direction along the predefined plane, and some of the photoelectric structures are arranged in the second direction and straddle adjacent two of the first substrates, respectively.

12. The electronic device of claim 10, wherein the conductive layer is defined with a first wire extending in the first direction and a second wire perpendicular to the first wire;
wherein, an additional signal is transmitted from the first wire of the conductive layer of one of the adjacent two first substrates to the conductive layer on the other one of the adjacent two first substrates in the first direction, through the signal line of one of the photoelectric structures straddling the adjacent two first substrates, and through corresponding ones of the first conductive structures in relation thereto; and the additional signal is further transmitted to the signal line of a next one of the photoelectric structures on the other one of the adjacent two first substrates in the second direction, through the signal line of an additional one of the photoelectric structures on the other one of the adjacent two first substrates, with or without the first conductive structures in relation thereto.

13. The electronic device of claim 11, wherein the conductive layer is defined with a first wire extending in the first direction and a second wire perpendicular to the first wire;
wherein, an additional signal is transmitted from the first wire of the conductive layer of one of the adjacent ones of the first substrates to the conductive layer on another one of the adjacent ones of the first substrates in the first direction, through the signal line of one photoelectric structure straddling the one and the another one first substrates in the first direction, and through corresponding ones of the first conductive structures in relation thereto; and the additional signal is further transmitted to the signal line of next one of the photoelectric structures on a next one of the adjacent ones of the first substrates in the second direction, through the signal line of an additional one photoelectric structure straddling the another one and the next one first substrates in the second direction, and through corresponding ones of the first conductive structures in relation thereto.

14. The electronic device of claim 1, wherein each of the first conductive structures comprises a conductive pillar and a conductive material, and the conductive material covers the conductive pillar.

15. The electronic device of claim 14, wherein the conductive pillar tapers off in a direction toward the photoelectric structures.

16. The electronic device of claim 6, wherein the third substrate is connected to the first substrates, the second conductive structures are disposed on the third substrate, each of the second conductive structures comprises a conductive pillar and a conductive material, and the conductive material covers the conductive pillar and is electrically connected to the conductive layers on adjacent two of the first substrates.

17. The electronic device of claim 16, wherein the conductive pillar tapers off in a direction toward the photoelectric structures.

18. The electronic device of claim 1, wherein each of the first substrates, the second substrates and the third substrate is a flexible substrate.

19. The electronic device of claim 1, wherein the electronic device is further defined with a peripheral area, the peripheral area excludes the photoelectric structures; the peripheral area is configured with at least one driving circuit.

20. The electronic device of claim 19, wherein the peripheral area comprises a connector board, and the driving circuit is disposed on the connector board.

21. The electronic device of claim 1, wherein a first gap is defined between adjacent two of the first substrates, a second gap is defined between adjacent two of the second substrates, and the first gap and the second gap are not overlapped in a vertical direction perpendicular to the predefined plane.

22. The electronic device of claim 21, wherein an amount of the third substrates are plural, and the third substrates are arranged in coplanar;
wherein, a third gap is defined between adjacent two of the third substrates, and the first gap, the second gap and the third gap are not overlapped in the vertical direction.

* * * * *